(12) United States Patent
Snyder

(10) Patent No.: US 10,968,830 B2
(45) Date of Patent: Apr. 6, 2021

(54) SYSTEMS AND METHODS FOR COOLING ELECTRONICS AND ELECTRICAL MACHINERY IN A HYBRID ELECTRIC AIRCRAFT

(71) Applicant: Rolls-Royce North American Technologies Inc., Indianapolis, IN (US)

(72) Inventor: Douglas J. Snyder, Carmel, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 119 days.

(21) Appl. No.: 16/015,904

(22) Filed: Jun. 22, 2018

(65) Prior Publication Data

US 2019/0390603 A1    Dec. 26, 2019

(51) Int. Cl.
  *F02C 7/18*      (2006.01)
  *F28D 15/02*     (2006.01)
  *H05K 7/20*      (2006.01)

(52) U.S. Cl.
  CPC ............ *F02C 7/185* (2013.01); *F28D 15/025* (2013.01); *H05K 7/203* (2013.01); *H05K 7/20309* (2013.01); *H05K 7/20318* (2013.01); *H05K 7/20327* (2013.01); *H05K 7/20381* (2013.01); *F05D 2220/323* (2013.01); *F05D 2260/232* (2013.01)

(58) Field of Classification Search
  CPC . F02C 7/18; F02C 7/185; F25D 15/02; H05K 7/203
  See application file for complete search history.

(56) References Cited

U.S. PATENT DOCUMENTS 2,970,437 A * 2/1961 Anderson ............... F02C 7/185
                                              60/785
3,429,122 A   2/1969 Pravda et al.
(Continued)

OTHER PUBLICATIONS

Extended European Search Report dated Mar. 11, 2019 in connection with European Patent Application No. 18187244.1, filed Aug. 3, 2018, applicant Rolls-Royce North American Technologies, Inc. (7 pages).

(Continued)

*Primary Examiner* — Brian M King
(74) *Attorney, Agent, or Firm* — Shumaker & Sieffert, P.A.

(57) ABSTRACT

Systems and methods for cooling electrical components disposed in a jet engine. An example system includes an evaporation chamber configured to contain the electrical components in contact with a coolant liquid. The coolant vapor formed during the heat transfer from the electrical components to the coolant liquid flows to a condenser assembly having a fuel-cooled condenser and an air-cooled condenser. The air-cooled condenser cools the coolant vapor to condensation using either fan stream air or engine bleed air from the intermediate pressure compressor or the high pressure compressor. An air cycle machine cools the engine bleed air. A controller may be used to select a coolant source for condensing the coolant vapor based on operating conditions of the aircraft. Spent air from the air-cooled condenser may be recycled back to the engine for engine cooling, added thrust, oil sump buffering, oil or fuel cooling, or blade tip clearance control.

15 Claims, 5 Drawing Sheets

(56) References Cited

U.S. PATENT DOCUMENTS

| | | | |
|---|---|---|---|
| 6,076,595 | A | 6/2000 | Austin et al. |
| 6,810,946 | B2 | 11/2004 | Hoang |
| 7,213,391 | B2 | 5/2007 | Jones |
| 8,424,285 | B2 | 4/2013 | Veilleux, Jr. |
| 8,910,465 | B2 | 12/2014 | Snyder |
| 9,157,328 | B2 | 10/2015 | Pope et al. |
| 9,482,451 | B2 | 11/2016 | Vaisman et al. |
| 9,587,561 | B2 | 3/2017 | Snyder et al. |
| 9,889,807 | B2 | 2/2018 | Siegel et al. |
| 2004/0020213 | A1* | 2/2004 | Jones .................... H05K 7/203 60/772 |
| 2005/0092469 | A1 | 5/2005 | Huang |
| 2007/0187072 | A1 | 8/2007 | Chin et al. |
| 2007/0284090 | A1 | 12/2007 | Wu et al. |
| 2008/0164010 | A1 | 7/2008 | Kang et al. |
| 2008/0283223 | A1 | 11/2008 | Chang et al. |
| 2010/0149755 | A1 | 6/2010 | Tomioka et al. |
| 2010/0300656 | A1 | 12/2010 | Lu et al. |
| 2011/0268562 | A1 | 11/2011 | Knight, III et al. |
| 2012/0000205 | A1 | 1/2012 | Coffinberry et al. |
| 2013/0111917 | A1 | 5/2013 | Ho et al. |
| 2013/0160974 | A1 | 6/2013 | Uchida |
| 2014/0165570 | A1 | 6/2014 | Herring |
| 2014/0246170 | A1 | 9/2014 | Snyder et al. |
| 2014/0260340 | A1 | 9/2014 | Vaisman et al. |
| 2015/0047315 | A1 | 2/2015 | Snyder |
| 2015/0305199 | A1 | 10/2015 | Yu |
| 2016/0215696 | A1 | 7/2016 | Snyder |
| 2016/0305279 | A1 | 10/2016 | Gerstler et al. |
| 2017/0184026 | A1 | 6/2017 | Elbibary et al. |
| 2018/0020573 | A1 | 1/2018 | Bouras et al. |
| 2018/0023416 | A1 | 1/2018 | Riaz et al. |
| 2018/0050810 | A1 | 2/2018 | Niergarth et al. |

OTHER PUBLICATIONS

Mudawar, "Recent Advances in High-Flux, Two-Phase Thermal Management", Journal of Thermal Science & Engineering Applications, Jun. 2013, 15 pgs.

http://norenproducts.com/industries/aerospace/; printed Jul. 11, 2017 (1 page).

http://norenproducts.com/products/heat-pipes/; printed Jul. 11, 2017 (2 pages).

http://www.sjsu.edu/people/nicole.okamoto/courses/me_146/FundamentalsofHeatPipesII.ppt; PowerPoint presentation "Fundamentals of Heat Pipes," SAIED, Widah, printed Jul. 11, 2017 (67 pages).

http://www.thermacore.com/products/loop-heat-pipes-and-loop-devices.aspx; printed Jul. 11, 2017 (1 page).

http://www.thermacore.com/applications/power-electronics-cooling.aspx; printed Jul. 11, 2017 (1 page).

http://www.1-act.com/loop-heat-pipe-design-manufacturing-and-testing-an-industrial-perspective/; Anderson, W.G. et al., printed Jul. 11, 2017 (11 pages).

http://webcache.googleusercontent.com/search?q=cache:http://file.scirp.org/Html/1-1520058_55065.htm&num=1&strip=1&vwsrc=0. Shukla, K.N. (2015) Heat Pipe for Aerospace Applications—An Overview. *Journal of Electronics Cooling and Thermal Control*, 5, 1-14. http://dx.doi.org/10.4236/jectc.2015.51001; printed Jul. 12, 2017 (14 pages).

Maydanik, Yu. F., "Loop heat pipes", Applied Thermal Engineering 25 (2005) 635-657, *Institute of Thermal Physics*, Ekaterinburg, Russia, printed Jul. 14, 2017 (1 page).

https://www.1-act.com/resources/heat-pipe-fundamentals/different-types-of-heat-pipes/thermosyphons/lo . . . printed Jul. 19, 2017 (3 pages).

https://www.1-act.com/products/high-performance-power-electronics-coolers/ printed Jul. 19, 2017 (3 pages).

https://www.1-act.com/resources/heat-pipe-fundamentals/different-types-of-heat-pipes/ printed Jul. 19, 2017 (2 pages).

https://en.wikipedia.org/wiki/Heat_pipe#Diode_heat_pipes printed Jul. 20, 2017 (10 pages).

https://www.electronics-cooling.com/2003/05/an-introduction-to-pulsating-heat-pipes/ printed Jul. 19, 2017 (6 pages).

Singh, Miniature Loop Heat Pipe With Flat Evaporator for Cooling Computer CPU, IEEE Transactions on Components and Packaging Technologies, vol. 30, No. 1, Mar. 2007 (8 pages).

\* cited by examiner

SYSTEMS AND METHODS FOR COOLING ELECTRONICS AND ELECTRICAL MACHINERY IN A HYBRID ELECTRIC AIRCRAFT

FIELD OF DISCLOSURE

The present invention relates to systems and methods for cooling electrical components, and more particularly, for cooling electrical components in a gas turbine engine.

BACKGROUND

Hybrid electric aerospace vehicles are being developed to power-assist a gas turbine engine using an electric drive. One problem such a combination of technologies raises is keeping the electrical systems cool. Electrical systems operating in a hybrid aerospace vehicle generate relatively large heat loads at very low temperatures relative to conventional gas turbine engine heat load temperatures. The types of components in electrical systems that may be subject to such high heat loads include power electronics, electric machines (generators, motors), and batteries. Each type of component has its cooling requirements and may be cooled using similar cooling systems and methods. Power electronic devices may have the most susceptibility in terms of the tolerance of such components to heat.

Historically, electrical components have been cooled with water based or oil based coolants that rely on sensible heat storage. The components may be mounted on a printed circuit board or other substrate, which may then be mounted to contact a cooled container of the water or oil. The cooled container would then absorb the heat generated by the components on the circuit board. In some solutions, a two-phased loop may be used in which the container contacting the electrical components may contain a coolant liquid that vaporizes upon absorbing the heat from the components. The vapor may be passed to a condenser, which may comprise a heat exchanger, to condense the vapor back to the cooling liquid. The cooling liquid is then passed back to the cooled container.

The condenser may typically be implemented as a heat sink for the coolant to reject its heat, which may be cooled using a cooling fluid, to effect condensation of the vaporized coolant. One difficulty in implementing condensers in an aerospace vehicle is in securing a sufficiently cool source of cooling fluid for the heat sink. One source may be the fan stream air flowing from the fan in the gas turbine engine. Another source may be the engine fuel, where the engine includes a flow path for the fuel to the heat sink before being fed to the combustors. Another source may be ambient air permitted to flow into the engine casing through a duct.

The options for cooling the vaporized coolant may be adequate, however, their cooling effectiveness depends on operating conditions. Fan air flow provides the best cooling effect at altitude where the air is much cooler. During take-off however, the fan air flow is typically too hot to provide much of a cooling effect. Cooling with a fuel flow is best during take-off when the fuel flow rate is high. At cruising speeds, the fuel flow rate drops and may not provide sufficient cooling. Ambient air, like fan air flow, is cool at higher altitude, but may be used during takeoff.

Some solutions use a combination of cooling sources controlled using valves to enable shutting off a source of cooling depending on operating conditions. However, solutions for cooling electronics will likely be implemented on the outer portion of the engine typically just inside the engine nacelle, due to the large size of the electrical system and its cooling system. In hybrid engines, it may be preferred to mount the electronics inboard of the fan stream of the engine; however, the electronics may be subject to more extreme heat.

One solution for cooling electronics on a jet engine allows for a liquid coolant to contact the components in an evaporator tank. The coolant is vaporized and allowed to flow to the condensers to condense the vapor back to a liquid. One problem with this solution on an aerospace vehicle is the liquid does not remain settled in contact with the components. The movement of the jet engine causes the solution to splash and stir in the tank leaving the component without contact with the liquid for periods of time during the flight. The components may be left uncooled for sufficient time to overheat.

SUMMARY

In view of the above, devices, systems and methods are provided to cool electrical components that generate a substantial amount of heat in a gas turbine engine. In one aspect, a system for cooling an electrical component in a gas turbine engine comprises an evaporation chamber configured to contain the electrical component and a cooling liquid in contact with the electrical component. The evaporation chamber includes a liquid input port and a vapor output port. The cooling liquid evaporates while cooling the electrical component and emits a coolant vapor via the vapor output port. The evaporation chamber receives condensed coolant liquid via the liquid input port. A condenser assembly is configured to receive the coolant vapor from the vapor output port of the evaporation chamber and to effect condensation of the coolant vapor using a cooling air flow. An air cycle machine is configured to cool engine bleed air to provide the cooling air flow to the condenser assembly.

In another aspect, a method is provided for cooling an electrical component disposed in an engine core of a gas turbine engine for an aircraft. An example method includes cooling a flow of engine bleed air at an air cycle machine. A coolant vapor is cooled at an air-cooled condenser using the cooled engine bleed air when the aircraft is preparing for take-off. The coolant vapor at the air-cooled condenser is cooled using a fan stream air flow when the aircraft has reached an altitude where the fan stream air flow enables cooling. An air/air valve is controlled to use the fan stream air flow to condense the coolant vapor at the air-cooled condenser or to use engine bleed air according to the aircraft operating conditions. A condensed coolant vapor flows from the air-cooled condenser to an evaporation chamber disposed in an engine core section of the gas turbine engine as a coolant liquid. The coolant liquid contacts the electrical component contained in the evaporation chamber to cool the electrical component. Coolant vapor is formed by absorption of heat from the electrical component into the cooling liquid coming from the air-cooled condenser.

Some examples of devices, systems, and methods for cooling electrical components in a gas turbine engine are outlined above rather broadly in order that the detailed description thereof may be better understood, and in order that the present contribution to the art may be better appreciated. Additional example implementations of the devices, systems, and methods are described below and will form the subject matter of the claims appended hereto. In this respect, before explaining at least one example of the devices, systems, and methods in detail, it is to be understood that the devices, systems, and methods are not limited in their application to the details of construction or to the arrangements of the components set forth in the following description or illustrated in the drawings. Other example implementations of the devices, systems, and methods may be developed, practiced and carried out in various ways. Also, it is to be understood that the phraseology and terminology employed herein are for the purpose of the description and should not be regarded as limiting.

DETAILED DESCRIPTION

Figure 1:
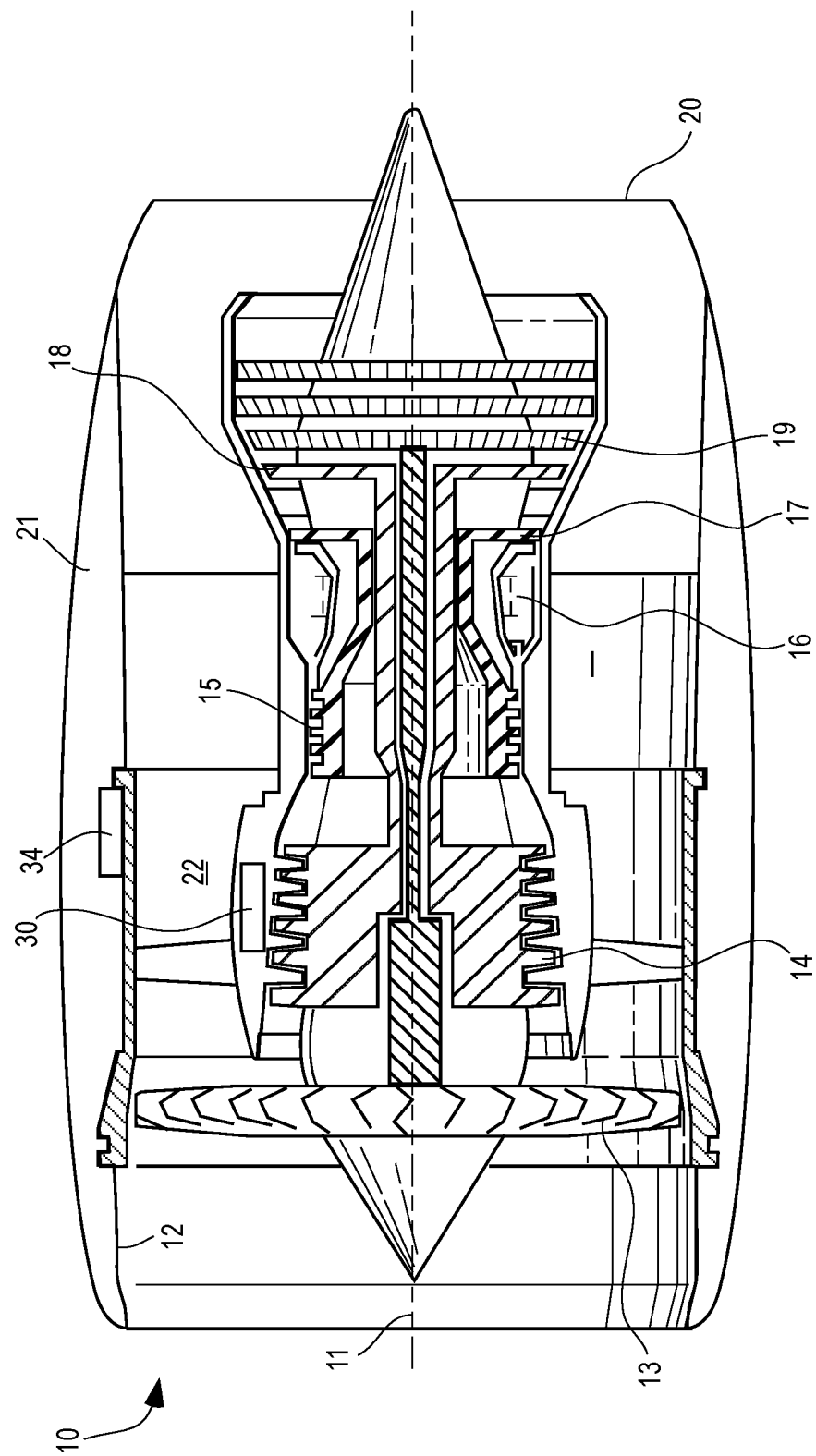
FIG. 1 is a side view of an example of a gas turbine engine containing a system for cooling electrical components in a core region of the jet engine.

Disclosed herein are systems and methods for cooling electrical components in a hybrid turbine engine. With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high pressure compressor 15, combustion equipment 16, a high pressure turbine 17, an intermediate pressure turbine 18, a low pressure turbine 19 and an exhaust nozzle 20. A nacelle 21 generally surrounds the engine 10 and defines both the intake 12 and the exhaust nozzle 20. The engine 10 includes a cooling system for cooling an electrical component, the cooling system comprising an evaporation chamber 30 and a condenser assembly 34. The electrical component may be a printed circuit board, an assembly of printed circuit boards, and one or more discrete electrical devices such as for example, power electronic devices configured for attachment as standalone components including insulated gate bipolar junction transistors (IGBT), MOSFETs, silicon-controlled rectifiers (SCR), and other similar devices. The electrical component may also include electrical machinery, such as electric motors, generators, batteries, and other electrical machines. In some example implementations, the evaporation chamber 30 may be configured for one type of electrical component, such as printed circuit boards and assemblies, and another evaporation chamber 30 may be added to contain other types of electrical components, such as an electric motor and/or generator or battery.

During operation, air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place. As shown in in FIG. 1 the evaporation chamber 30 may be disposed inboard of the fan stream between the first air flow and the second air flow. In the example shown in FIG. 1, the evaporation chamber 30 is disposed in an enclosure containing the intermediate pressure compressor 14. The condenser assembly 34 may be disposed inside the nacelle 21 as depicted in FIG. 1, or in any suitable part of the engine 10 from which the condenser assembly 34 can draw from heatsinking sources as described in more detail below with reference to FIG. 4.

The compressed air exhausted from the high pressure compressor 15 is directed into the combustion equipment 16 where it is mixed with fuel and the mixture combusted. The resultant hot combustion products then expand through, and thereby drive the high, intermediate and low pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

As noted above, the electrical component or components in the cooling system evaporation chamber is cooled in order to enable operation within the extreme heat that may develop in the engine 10 as well as to remove the heat generated by the electrical component or components. In an example implementation, the cooling system comprises the evaporation chamber 30 and the condenser assembly 34. The evaporation chamber 30 contains the electrical component, or components, and a cooling agent in the form of a cooling liquid. The cooling liquid evaporates during the exchange of heat with the electrical component, turning into a coolant vapor. The coolant vapor flows to the condenser assembly, which effects condensation back to the liquid phase. Coolant liquid is then permitted to flow back to the evaporation chamber.

In an example implementation, the condenser assembly 34 includes a fuel-cooled condenser and an air-cooled condenser. The coolant vapor may flow through either, or both, the fuel-cooled condenser or the air-cooled condenser. The air-cooled condenser may include multiple and switchable coolant sources that may be used to condense the coolant vapor. The coolant sources for the air-cooled condenser include a fan stream air flow, an ambient air flow (or ram air flow), an engine bleed from the high-pressure compressor 15, and an engine bleed from the intermediate-pressure compressor 14. The fan stream air flow may be permitted to flow to the air-cooled condenser by a fan stream flow path extending from the bypass duct 22 to the condenser assembly. The ambient air flow may be received at the condenser assembly in the space between the nacelle 21 and a casing surrounding the bypass duct 22. The engine bleed air from the intermediate-pressure compressor 14 and the high-pressure compressor 15 may be pre-cooled using an air cycle machine as described in more detail below with reference to FIGS. 4 and 5.

In an example implementation, a controller may provide program control over the selection of a coolant source for condensing the coolant vapor. The controller may receive inputs from temperature sensors, altitude sensors, air flow sensors, or any other sensors strategically placed to enable the controller to determine the best coolant source to use to condense the coolant vapor. The controller may switch the state of valves to enable or disable a selected coolant source.

In an example implementation, the air-cooled condenser is configured to recycle spent air, which is air that has been used to cool coolant vapor to condensation, by conducting the spent air in a useful way. If the spent air comes from having used fan air flow for condensing the coolant vapor, the spent air may be returned to a lower pressure region of the fan stream or passed through a separate nozzle to produce some engine thrust. If the spent air comes from having used engine bleed air, the spent air may still have sufficient pressure to be returned to the engine to be used as buffer air for bearing sumps or for cooling in some portion of the engine, such as turbine tip clearance control or the oil system or even possibly the fuel.

Figure 2:
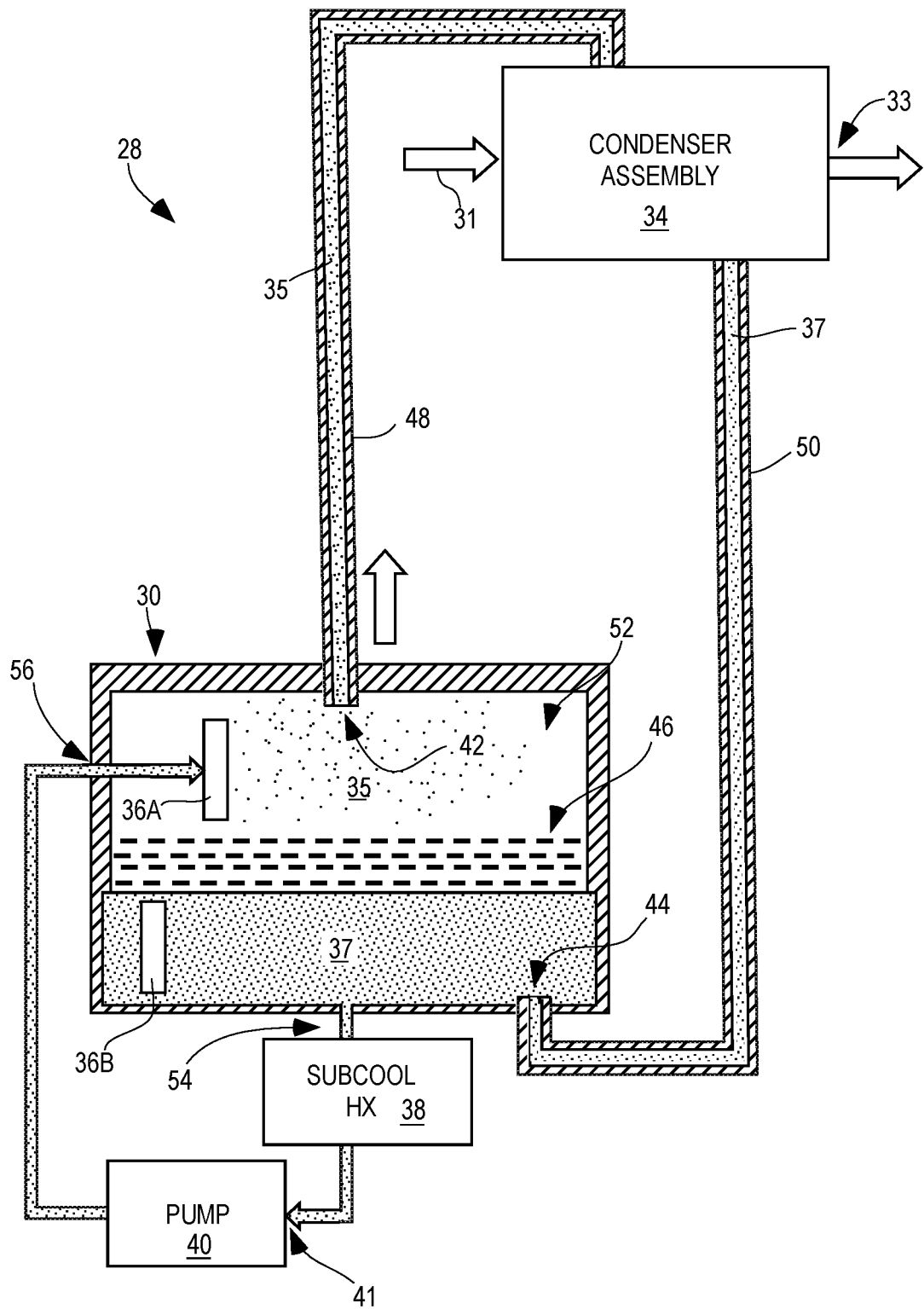
FIG. 2 is a schematic diagram illustrating operation of an example system for cooling electrical components.

FIG. 2 is a schematic diagram illustrating operation of an example system 28 for cooling electrical components 36A and 36B. The cooling system 28 includes an evaporation chamber 30 and a condenser assembly 34. The evaporation chamber 30 contains the electronic components 36A and 36B and a liquid coolant 37 such that the liquid coolant 37 is in contact with the electrical components 36A and 36B. The cooling of the electrical components 36A and 36B causes the liquid coolant 37 to vaporize into a coolant vapor 35. The evaporation chamber 30 includes a coolant vapor output port 42 to enable the coolant vapor 35 to flow through a first fluid conduit 48 to the condenser assembly 34. The condenser assembly 34 uses a condensing fluid 31, which is colder than the coolant vapor 35, to condense the coolant vapor 35 back to the coolant liquid 37. The condenser assembly 34 outputs a spent condensing fluid 33 to either fuel the engine if the cooling fluid is cooling fuel, or to provide a useful function if the condensing fluid is a cooling air. The coolant liquid 37 from the condenser assembly 34 flows through a second fluid conduit 50 back to a liquid input port 44 on the evaporation chamber 32.

In an example implementation, the coolant liquid 37 may include any suitable refrigerant, such as R134a, R245fa, Fluorinert and Novec (available from 3M™), or other suitable refrigerant fluids that have a liquid/vapor transition in the temperature range of the system being cooled. In the example in FIG. 2, the system being cooled includes the electrical components 36A and 36B, which in some example implementations may operate in the range of about 100 to 200 degrees C. The electrical components 36 may include power electronics boards 36A and 36B embedded inside of the evaporation chamber 30, which is preferably hermetically sealed. The evaporation chamber 30 may be evacuated before adding the working fluid. The power electronics boards 36A and 36B may include components that contain power devices, such as MOSFETS or IGBTs or other similar components such as capacitors and inductors.

As noted above, the coolant liquid 37 cools the electrical components 36A and 36B by contact. The coolant liquid 37 may be in contact with the electrical components 36A and 36B in one of two ways. FIG. 2 shows a first way in which the coolant liquid 37 exits the evaporation chamber 30 via liquid output port 54 and pumped back into the evaporation chamber 30 at liquid input port 56. The coolant liquid 37 is then directed to liquid input port 56 to cool the first electrical component 36A by direct impingement. The coolant liquid 37 may be sub-cooled by a sub-cooling heat exchanger 38 to ensure that the pump 40 receives the coolant in liquid form and not vapor form thereby preventing cavitation of the pump 40. The subcooling can also improve the critical heat flux of the coolant 37, when cooling electrical component 36A. The cooling of the first electrical component 36A by direct impingement enables constant cooling in the event of aircraft maneuvers or aircraft buffeting from turbulence.

FIG. 2 also shows the electrical component 36B cooled by submerging the electrical component 36B in the coolant liquid 37. By containing the electrical components 36 in the evaporation chamber 32, the electrical systems may be able to operate at higher voltages since the coolant fluid in the evaporation chamber 32 prevents electrical discharges.

It is noted that the evaporation chamber 30 may take any suitable shape to form a container having at least one wall 52 (e.g. for a cylindrical or spherical container). The evaporation chamber 30 in FIG. 2 includes a baffle structure 46 attached to the wall 52 or walls of the evaporation chamber 30. The baffle structure 46 provides a mechanism for resisting fluid redistribution in the evaporation chamber 30 during aircraft maneuvers or during aircraft buffeting from atmospheric turbulence. The resistance to the fluid redistribution helps maintain the second electrical component 36B submerged in the coolant liquid 37 and also to maintain liquid at the pump inlet 54.

Figure 3:
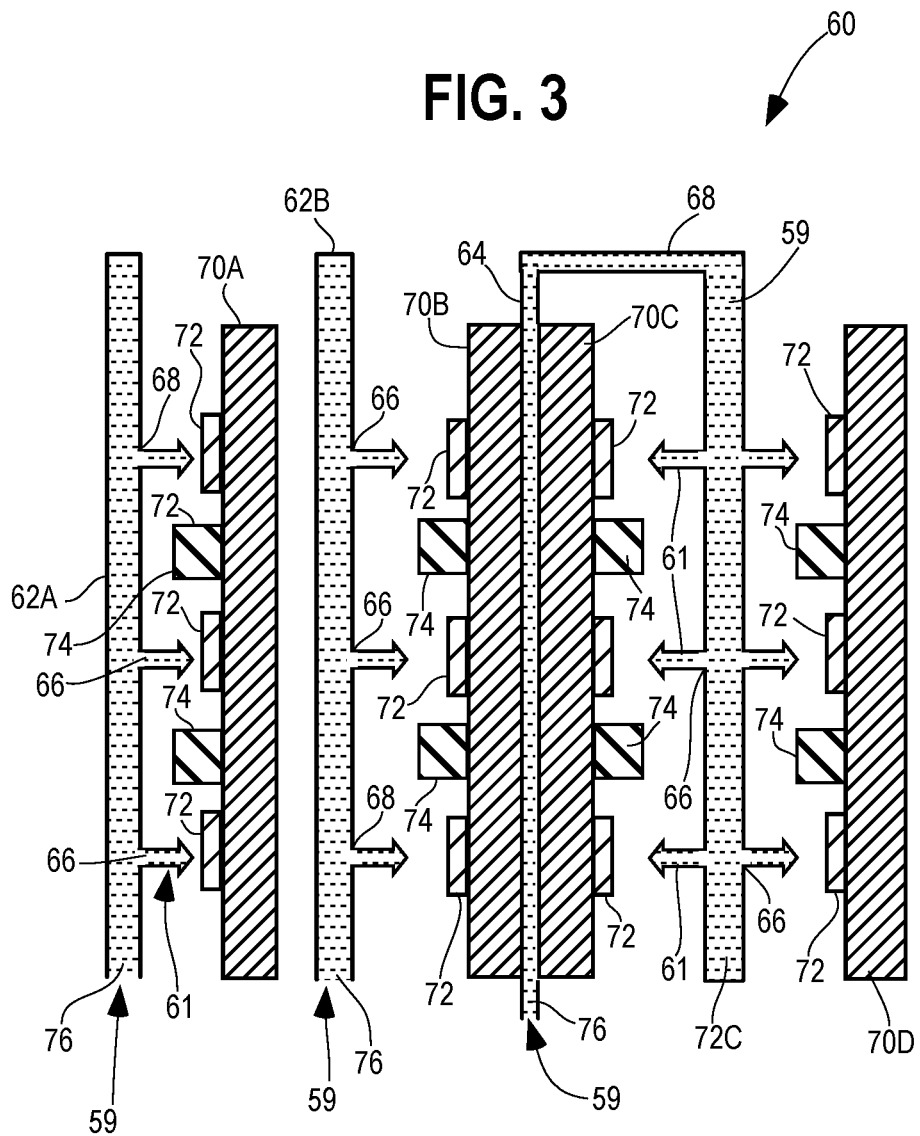
FIG. 3 is a schematic diagram of an example implementation of an evaporation chamber containing electrical components being cooled by contact with a liquid coolant.

FIG. 3 is a schematic diagram of an example implementation of an evaporation chamber with a direct impingement cooling system 60 containing electrical components 70A, 70B, 70C, and 70D being cooled by direct impingement with a coolant liquid 59 entering a fluid conduit 62A, 62B, and 62C. The electrical components 70A, 70B, 70C, and 70D may be mounted in the evaporation chamber 30 (in FIG. 2) to receive the coolant liquid by direct impingement. The first printed circuit board 70A is mounted opposite a first fluid conduit 62A having liquid openings 66. The coolant liquid 59 enters an opening at one end of the first fluid conduit 62A. The opposite end of the first fluid conduit 62A is closed to allow the formation of liquid jets 61 aimed to contact the first printed circuit board 70A. In an example implementation, the liquid jets 61 may be aligned with high heat-generating devices 72, such as MOSFETs, IGBTs, etc. to maximize the cooling effect directly on the components on the printed circuit board 60A that run hottest. Other devices 74 may be cooled by residual splashing of the coolant liquid.

The second printed circuit board 70B is mounted with one side in contact with a cold plate 64. The cold plate 64 is formed as a container having an opening 76 for receiving coolant liquid. The container shape may be any suitable shape configured to provide a maximum cooling effect for the printed circuit board 70B. The container forming the cold plate 64 may include internal fins or mini/micro channels for enhancing heat transfer. The cold plate 64 may be disposed to cool the printed circuit boards 70B and 70C mounted on opposite sides of the cold plate 64 as shown in FIG. 3. The printed circuit board 70B may be cooled on one side by the cold plate 64 and on the other side by a second fluid conduit 62B with liquid openings 66 to produce liquid jets aimed at heat-generating devices 72 on the second printed circuit board 70B. The cold plate 64 in FIG. 3 may include a fluid passage 68 to a third fluid conduit 62C with liquid openings 66 aimed to direct liquid jets 61 at components 72 on the third printed circuit board 70C, thereby providing a double-sided cooling of the third printed circuit board 70C. The third fluid conduit 62C may also include liquid openings 66 on an opposite side to cool the fourth printed circuit board 70D.

The direct impingement cooling structure illustrated in FIG. 3 may be configured in any suitable way with more or fewer printed circuit boards 70 and with more or fewer fluid conduits 62 and cold plates 64. The fluid conduits 62 may also differ in the number and types of jets 66. The direct impingement cooling system 60 may be further combined in the evaporation chamber 30 with structure for mounting other components that need cooling, such as the submerged electrical component 36B shown in FIG. 2.

Figure 4:
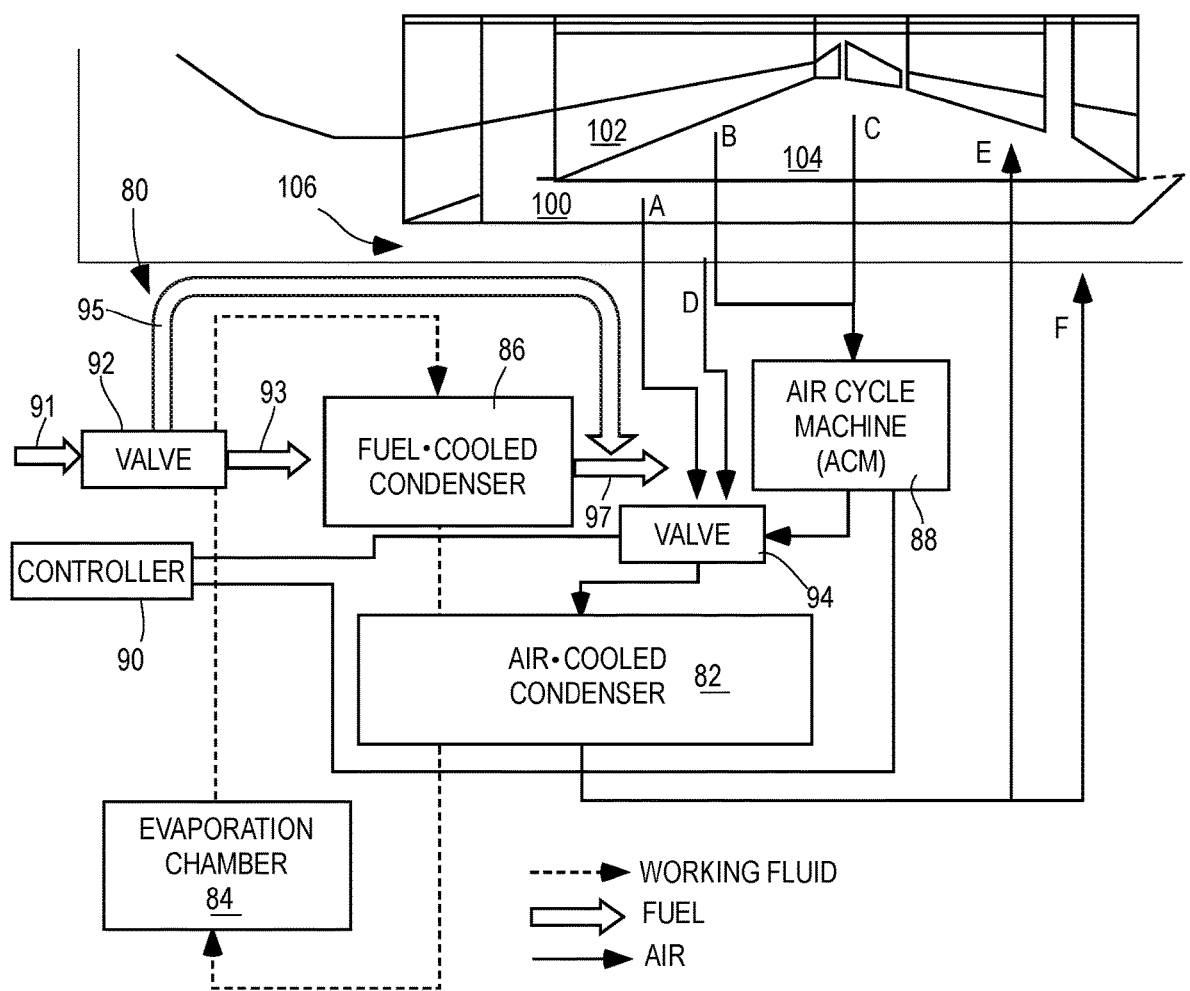
FIG. 4 is a schematic diagram illustrating operation of a system for condensing a coolant vapor to a coolant liquid for cooling electrical components.

FIG. 4 is a schematic diagram illustrating operation of a system 80 for condensing a coolant vapor to a coolant liquid for cooling electrical components. FIG. 4 shows an evaporator chamber 84 forming the 2-phase loop with a condenser assembly similar to the cooling system 28 in FIG. 2. The condenser assembly in FIG. 4 includes a fuel-cooled condenser 86 and an air-cooled condenser 82. The fuel-cooled condenser 86 receives a cooling fuel flow 93 as part of a fuel flow 97 used to power the engine. The fuel flow 97 may include fuel that has a portion recirculated back to the aircraft fuel tanks. The fuel-cooled condenser 86 is used to cool the coolant vapor to condensation. The cooling effect provided by the cooling fuel flow may be best during take-off or other operating conditions when the rate of fuel flow is greatest. A fuel valve 92 may be used to reduce or stop the fuel flow for cooling the coolant vapor to condensation when the fuel becomes too hot to provide a cooling effect. The fuel valve 92 may circulate all or part of the fuel flow at 91 to bypass the fuel-cooled condenser 86 at 95. A controller 90 may be programmed to control the state of the fuel valve 92 based on a variety of engine operating conditions, such as, for example, the fuel temperature, air temperature at various heatsinking sources described below, fuel flow rate, and other operating conditions.

The coolant vapor may also be cooled by the air-cooled condenser 82, which may provide a cooling air flow from one or more selected sources. For example, the sources of cooling air may be a fan 100 air stream at A, an intermediate pressure compressor 102 engine bleed air at B, a high pressure compressor 104 engine bleed air at C, or an ambient air stream at D. The selection of either the fan air stream at A, the engine bleed air at B and/or at C, or the ambient air stream at D may be switched by an air valve 94. The controller 90 may be programmed to control the valve 94 to select the air source that provides the best cooling given the operating conditions. For example, during take-off, the controller may control the air/air valve 78 to select an engine bleed at B and/or at C over the fan air stream at A since the fan air stream at A may not be sufficiently cool to provide a cooling effect to condensation. Alternatively, the controller may select the air valve 94 to disable both air sources in favor of using fuel-cooled condensation at the fuel-cooled condenser 86 during take-off. The controller 90 may then control the air valve 94 to select the fan air stream at A or ambient air flow at D over the engine bleed at B or at C at cruising speed and altitude when the fan stream air flow and/or the ambient air flow are cooler. The controller 90 may also disable the fuel-flow cooling during idle descent when the fuel heat sink is too low and the temperature of the fuel is too hot to provide sufficiently cool fuel to the coolant vapor.

The air-cooled condenser 82 may conduct spent air, or air used to cool the coolant vapor back into the engine in a useful manner. For example, the spent air may be used to cool the engine at E or to provide thrust at F.

Figure 5:
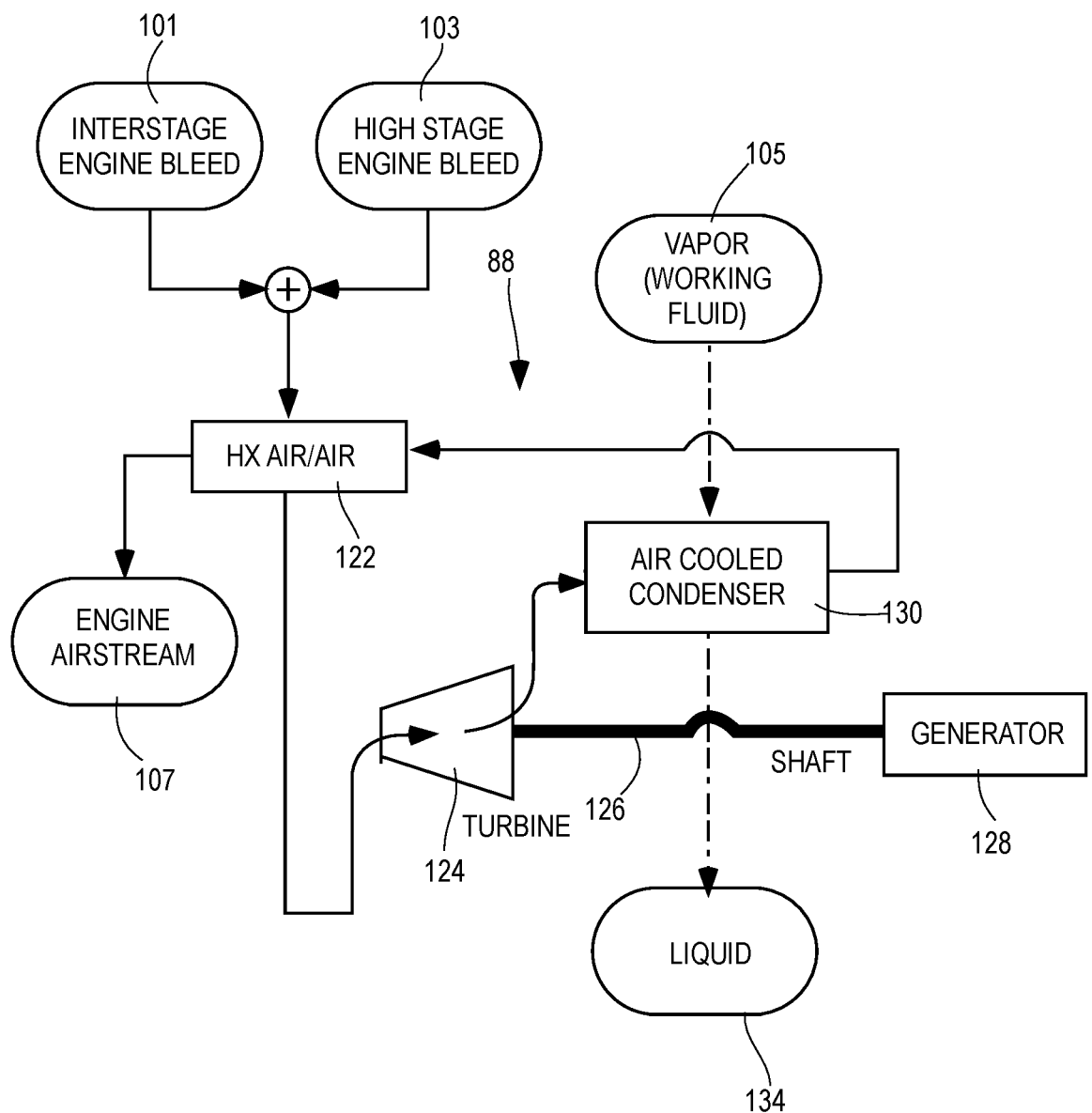
FIG. 5 is a block diagram illustrating operation of an example of a condensing system using an air cycling machine.

The engine bleed air B or C may be pre-cooled by an air cycle machine (ACM) 88. FIG. 5 is a block diagram illustrating operation of an example of a condensing system using an air cycling machine 88. The ACM 88 in FIG. 5 may include a heat exchanger 122 that receives air from an air-cooled condenser 130, which may operate as described above with reference to FIGS. 1 and 4, to cool an intermediate stage engine bleed air at 101 or a high pressure engine bleed air at 103. The intermediate stage engine bleed air at 101 is received from the intermediate pressure compressor 102 shown in FIG. 4. The high pressure stage engine bleed air at 103 is received from the high pressure compressor 104 as shown in FIG. 4. The cooled engine bleed air from 101 and/or 103 may exit the heat exchanger 122 into a turbine 124 and eventually into an engine airstream 107 (E or F) as described with reference to FIG. 4) after its cooling function in the air-cooled condenser 130 is completed. The air flowing into the turbine 124 assists in operating a shaft 126, which may be used to rotate a generator 128. The generator 128 may be used to provide electrical power for other aircraft functions, such as lighting, control functions, and other functions in the cabin. FIG. 5 shows the turbine 124 providing cooling air at the air-cooled condenser 130 for cooling the coolant vapor to condensation as cooling liquid 134. The work performed by the air flowing through the turbine 124 has a cooling effect for air flowing into the air-cooled condenser 130, which remains sufficiently cool to provide a heat sink in the heat exchanger 122.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure. Numerous modifications to the present disclosure will be apparent to those skilled in the art in view of the foregoing description. It should be understood that the illustrated embodiments are exemplary only, and should not be taken as limiting the scope of the disclosure.

What is claimed is:

1. A system for cooling an electrical component in association with a gas turbine engine, the system comprising:
   an evaporation chamber configured to contain the electrical component and a cooling liquid in contact with the electrical component, wherein the evaporation chamber comprises a liquid input port, a liquid outlet port, a pumped liquid input port, and a vapor output port, wherein the cooling liquid evaporates while cooling the electrical component and emits coolant vapor via the vapor output port and wherein the evaporation chamber receives condensed coolant liquid via the liquid input port;
   a coolant pump configured to receive at least a portion of the cooling liquid from the liquid output port of the evaporation chamber, and to pump the cooling liquid to the pumped liquid input port of the evaporation chamber to direct a plurality of liquid jets at portions of the electrical component;
   an air cycle machine comprising a heat exchanger and a turbine, wherein the air cycle machine is configured to receive engine bleed air from the gas turbine engine and cool the engine bleed air, and wherein the cooled engine bleed air comprises a cooling air flow; and a condenser assembly configured to:
  receive the coolant vapor from the vapor output port of the evaporation chamber,
  receive the cooling air flow from the air cycle machine, and
  cool the coolant vapor using the cooling air flow to cause the coolant vapor to condense.

2. The system of claim 1, further comprising a sub-cooling heat exchanger configured to cool the cooling liquid from the liquid output port to form a subcooled liquid and to flow the subcooled liquid to the coolant pump to prevent cavitation of the coolant pump.

3. The system of claim 1, further comprising a cold plate coupled to at least one side of the electrical component, wherein the cold plate comprises flow channels configured to effect a flow of the cooling liquid from the coolant pump to cool the at least one side of the electrical component.

4. The system of claim 1, wherein the electrical component comprises a printed circuit board having high power devices and low power devices, and wherein the system further comprises a fluid conduit coupled to the coolant pump and having a plurality of jet openings to direct the plurality of liquid jets towards the printed circuit board.

5. The system of claim 4, wherein the evaporation chamber further comprises:
  a first component support configured to hold the printed circuit board in position to receive at least one liquid jet of the plurality of liquid jets from the fluid conduit; and
  a second component support configured to hold a second electric component immersed in the cooling liquid.

6. The system of claim 4, wherein the plurality of jet openings are positioned on the fluid conduit to direct the plurality of liquid jets towards the high power devices on the printed circuit board.

7. The system of claim 1, wherein the evaporation chamber further comprises:
  at least one wall forming a liquid containing portion of the evaporation chamber; and
  a baffle extending parallel to a liquid surface of the cooling liquid in the evaporation chamber, wherein the baffle is mounted on the at least one wall to maintain cooling liquid below the baffle in the liquid containing portion.

8. The system of claim 1, wherein the engine bleed air includes an intermediate pressure compressor bleed.

9. The system of claim 1, wherein the engine bleed air includes a high pressure compressor bleed.

10. The system of claim 1, wherein the condenser assembly comprises:
  a fuel-cooled condenser configured to cool the coolant vapor using a cooling fuel flow; and
  an air-cooled condenser configured to cool the coolant vapor using a fan air stream or the cooling air flow.

11. The system of claim 10, further comprising an air valve configured to be switched between a first air flow path comprising the fan air stream and a second air flow path comprising the cooling air flow.

12. The system of claim 11, wherein the air valve is further switchable between a third flow path comprising an ambient air flow.

13. The system of claim 11, further comprising a fuel valve switchable between providing the cooling fuel flow to the fuel-cooled condenser and bypassing the fuel-cooled condenser.

14. The system of claim 13, further comprising a controller configured to control the switching of the air valve and the fuel valve.

15. The system of claim 1, further comprising a spent air flow path for coolant air from the condenser assembly to either cool engine components or provide thrust.

* * * * *